(12) United States Patent
Juengling

(10) Patent No.: US 10,388,606 B2
(45) Date of Patent: *Aug. 20, 2019

(54) INTEGRATED ASSEMBLIES HAVING STRUCTURES ALONG A FIRST PITCH COUPLED WITH STRUCTURES ALONG A SECOND PITCH DIFFERENT FROM THE FIRST PITCH, AND METHODS OF FORMING INTEGRATED ASSEMBLIES

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/010,734

(22) Filed: Jun. 18, 2018

(65) Prior Publication Data

US 2019/0067195 A1 Feb. 28, 2019

Related U.S. Application Data

(63) Continuation of application No. 15/690,209, filed on Aug. 29, 2017.

(51) Int. Cl.
*H01L 23/528* (2006.01)
*H01L 23/532* (2006.01)
*H01L 21/768* (2006.01)
*H01L 27/115* (2017.01)

(52) U.S. Cl.
CPC ...... *H01L 23/5283* (2013.01); *H01L 21/7685* (2013.01); *H01L 21/76879* (2013.01); *H01L 23/53295* (2013.01); *H01L 27/115* (2013.01)

(58) Field of Classification Search
CPC .......... H01L 27/0207; H01L 27/11519; H01L 27/11551; H01L 27/11524; H01L 27/11565; H01L 27/11556; H01L 27/11582; H01L 23/5226
See application file for complete search history.

(56) References Cited

U.S. PATENT DOCUMENTS

| | | |
|---|---|---|
| 6,727,174 B1 | 4/2004 | Kotecki et al. |
| 6,911,389 B2 | 6/2005 | Brennan et al. |
| 7,592,649 B2 * | 9/2009 | Chung .................. H01L 27/105 257/208 |
| 2009/0166872 A1 | 7/2009 | Chung |

* cited by examiner

*Primary Examiner* — Roy K Potter
(74) *Attorney, Agent, or Firm* — Wells St. John P.S.

(57) ABSTRACT

Some embodiments include a method of forming an integrated assembly. Conductive lines are formed to extend along a first direction, and are spaced from one another by a first pitch. Protective knobs are formed over the conductive lines and are arranged in rows. The protective knobs within each row are spaced along a second pitch which is greater than the first pitch. The protective knobs protect regions of the conductive lines while leaving other regions of the conductive lines unprotected. The unprotected regions are recessed so that the protected regions become tall regions and the unprotected regions become short regions. The protective knobs are removed. Conductive structures are formed over the conductive lines. The conductive structures are spaced along the second pitch. Each of the conductive lines is uniquely coupled to only one of the conductive structures. Some embodiments include integrated assemblies.

13 Claims, 19 Drawing Sheets

INTEGRATED ASSEMBLIES HAVING STRUCTURES ALONG A FIRST PITCH COUPLED WITH STRUCTURES ALONG A SECOND PITCH DIFFERENT FROM THE FIRST PITCH, AND METHODS OF FORMING INTEGRATED ASSEMBLIES

RELATED PATENT DATA

This patent resulted from a continuation of U.S. patent application Ser. No. 15/690,209, which was filed Aug. 29, 2017, and which is hereby incorporated herein by reference.

TECHNICAL FIELD

Integrated assemblies having structures along a first pitch coupled with structures along a second pitch different from the first pitch, and methods of forming integrated assemblies.

BACKGROUND

Integrated circuitry may include highly-integrated structures formed along a relatively tight (i.e., small) pitch in order to achieve a high packing density. For instance, memory cells may be arranged in a configuration having a high packing density. The memory cells may be addressed utilizing wordlines and digit lines; with the wordlines extending along a first direction and the digit lines extending along a second direction which intersects the first direction. The wordlines and digit lines may be formed along a tight pitch in order to enable suitable addressing of the tightly-packed memory cells.

The integrated circuitry may also include structures formed along a relatively loose (i.e., large) pitch. Such structures may include logic, wordline drivers, sense amplifiers, sensors, etc. The terms "relatively loose" and "relatively tight" are utilized in relation to one another, with the relatively loose pitch being larger than the relatively tight pitch.

It may be desired to couple the structures formed along the relatively loose pitch with the structures formed along the relatively tight pitch. For instance, it may be desired to couple wordline drivers with wordlines, sense amplifiers with digit lines, etc. It can be difficult to achieve such coupling, and accordingly it is desired to develop methods and architectures suitable for coupling structures formed along a relatively loose pitch with structures formed along a relatively tight pitch.

DETAILED DESCRIPTION OF THE ILLUSTRATED EMBODIMENTS

Integrated circuitry may include connections between features formed at a relatively tight pitch and features formed at a relatively loose pitch. Embodiments described herein may provide methods and architectures for achieving such connections.

Figure 1:
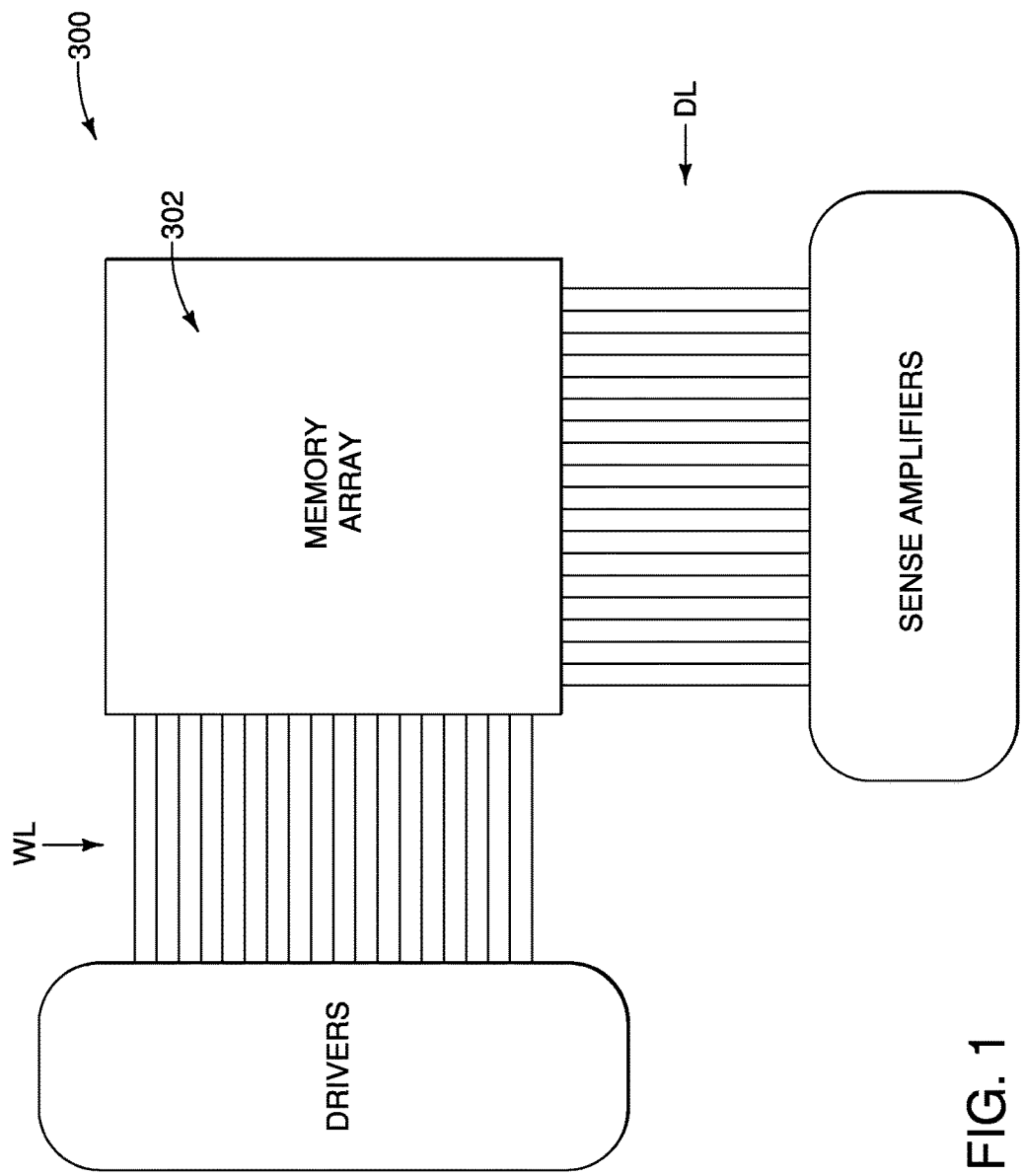
FIG. 1 is a diagrammatic schematic view of portions of an example integrated circuit.

FIG. 1 shows a region of an integrated circuit 300, and shows an example application in which connections may be formed between relatively tightly-pitched features and relatively loosely-pitched features. The integrated circuit 300 includes a memory array 302, which may have a plurality of memory cells formed in a high-density array. The memory array comprises rows and columns. Wordlines WL extend into the memory array 302 along the rows of the array; and digit lines DL extend into the memory array 302 along the columns of the array. The rows and columns may be orthogonal to one another, or may intersect along any suitable angle, such as, for example, 30°, 45°, 60°, etc. Each memory cell within the memory array may be uniquely addressed with the combination of a wordline WL and a digit line DL. A relatively small number of wordlines WL and digit lines DL are shown in FIG. 1 for purposes of illustration. In actual practice, there may be thousands, millions, hundreds of millions, billions, etc., of memory cells within the memory array, and an associated large number of wordlines WL and digit lines DL extending into the memory array.

The wordlines WL and digit lines DL are provided at a relatively tight pitch in order to extend across the rows and columns of the densely-packed memory cells within the memory array 302. The wordlines WL and the digit lines DL extend to circuitry external of the memory array, and such circuitry may be provided at a relatively-loose pitch. For instance, the wordlines WL are shown extending to wordline drivers, and the digit lines DL are shown extending to sense amplifiers.

Figure 2:
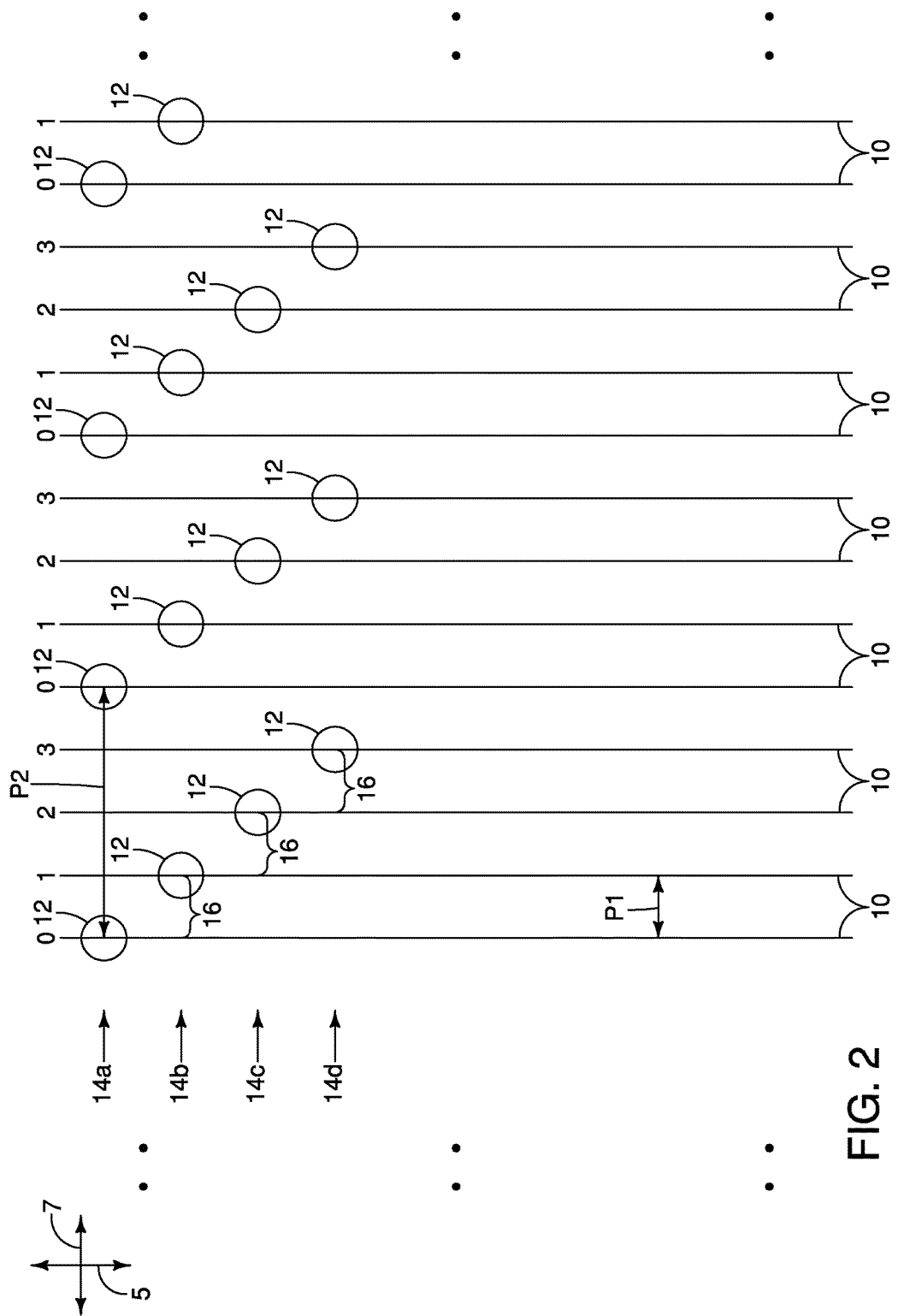
FIG. 2 is a diagrammatic schematic view of a region of an example integrated circuit, and such region may be an expanded region of the integrated circuit of FIG. 1.

The actual connections between the tightly-pitched structures and the loosely-pitched structures may utilize a repeating pattern of conductive structures. For instance, FIG. 2 shows a pattern which may be utilized for coupling tightly-pitched features (e.g., lines 10) with more loosely-pitched features through conductive structures 12 which are on a pitch substantially identical to the pitch of the loosely-pitched features (with the term "substantially identical" meaning identical to within reasonable tolerances of fabrication and measurement). The lines 10 may be, for example, the wordlines WL or digit lines DL described above with reference to FIG. 1; and the more loosely-pitched features may correspond to, for example, features associated with wordline drivers or sense amplifiers relative to the application of FIG. 1.

In the illustrated embodiment of FIG. 2, the tightly-pitched features 10 are on a pitch P1 and the conductive structures 12 are on a pitch P2, with the pitch P2 being about four-times greater than the pitch P1. In some embodiments, the pitches P1 and P2 may be referred to as first and second pitches, respectively.

A bar of repeating numbers 0, 1, 2, 3 is provided over the lines 10 to assist the reader in recognizing a repeating pattern formed between the lines 10 and the conductive structures 12. In other embodiments, the relationship between the pitches P2 and P1 may be different than the illustrated 4:1 relationship, and accordingly the repeating pattern may be different. Generally, the pitch P2 will be at least about two-times as large as the pitch P1 (and in some embodiments may be at least three-times as large as the pitch P1, at least four-times as large as the pitch P1, etc.).

In some embodiments, the lines 10 may be considered to extend along a direction represented by an axis 5. The conductive structures 12 may be considered to be formed along rows 14a-14d which extend along another direction represented by an axis 7. The term "row" as utilized relative to FIG. 2 (and the FIGS. 3-13 which follow) is not to be confused with the rows extending across the memory array 302 of FIG. 1. Specifically, the rows extending across the memory array 302 are associated with wordlines. In contrast, the rows 14 described with reference to FIGS. 2-11 are simply rows along which conductive structures may be fabricated, and may be along any suitable direction associated with integrated circuitry; including, for example, the row direction of FIG. 1, the column direction of FIG. 1, etc.

The axes 5 and 7 are substantially orthogonal to one another in the embodiment of FIG. 2, with the term "substantially orthogonal" meaning orthogonal to within reasonable tolerances of fabrication and measurement. In some embodiments, the relative directions of axes 5 and 7 may be referred to as first and second directions, respectively. Adjacent rows 14 are offset relative to one another along the second direction of axis 7 by an increment 16 corresponding to the pitch P1 (or in other words by a fraction of the pitch P2, and in the illustrated embodiment by an increment corresponding to about one-fourth of the pitch P2). Specifically, the row 14b is offset along the second direction of axis 7 from the row 14a by the increment 16, the row 14c is offset along the second direction of axis 7 from the row 14b by the increment 16, and the row 14d is offset along the second direction of axis 7 from the row 14c by the increment 16. Although P1 is shown to be about one-fourth of P2, in other embodiments P1 may be any suitable fraction of P2; such as, for example, about one-half of P2, about one-third of P2, etc.

Although the axes 5 and 7 are shown to be substantially orthogonal to one another, in other embodiments the rows (e.g., 14a-14d) may extend along an axis which is at an angle other than 90° relative to the direction of lines 10. Such angle may be any suitable angle, such as, for example, about 30°, about 45°, about 60°, etc. In some embodiments, the ratio of the change in the x direction (the direction along axis 7) relative to the change in the y-direction (the direction along axis 5) pertaining to the locations of conductive structures 12 may be 1:4; 1:3, 1:2, etc.

Each of the conductive lines 10 within the configuration of FIG. 2 is uniquely coupled to one of the conductive structures 12.

Figure 3:
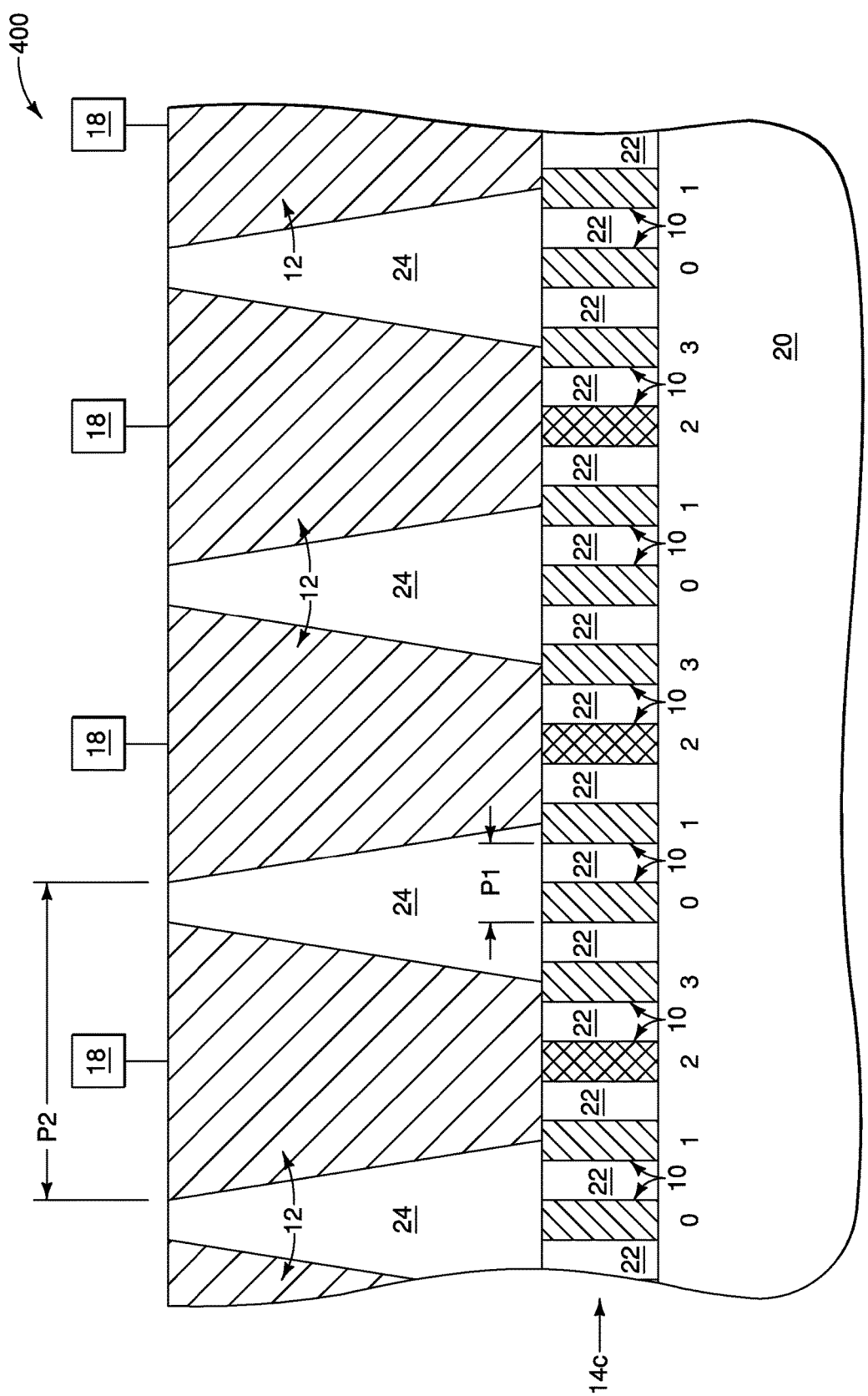
FIG. 3 is a diagrammatic cross-sectional side view of a portion of an example integrated circuit illustrating coupling between features formed along a relatively tight pitch with features formed along a relatively loose pitch.

FIG. 3 shows a construction 400 illustrating a difficulty which may occur in attempting to specifically couple some of the conductive lines 10 within one of the rows 14a-14d to the conductive structures 12. The construction 400 is shown along a cross-section through the row 14c. The lines 10 are shown to be along the pitch P1, and the conductive structures 12 are shown to be along the pitch P2. The conductive structures 12 extend to circuitry 18. The circuitry 18 may correspond to any suitable circuitry including, for example, wordline drivers, sense amplifiers, etc. The conductive lines 10 are over an insulative material 20, and are laterally spaced from one another by an insulative material 22. The materials 20 and 22 may comprise any suitable insulative composition(s); including, for example, one or both of silicon dioxide and silicon nitride. The materials 20 and 22 may be compositionally different from one another in some embodiments, or may be compositionally the same as one another and merge into a single material between and below the lines 10.

The conductive structures 12 are laterally spaced from one another by insulative material 24. The insulative material 24 may comprise any suitable composition(s); including, for example, one or both of silicon dioxide and silicon nitride. The material 24 may be compositionally different from one or both of the materials 20 and 22, or may be compositionally the same as one or both of the materials 20 and 22.

The bar of repeating numbers 0, 1, 2, 3 is provided beneath the lines 10 of FIG. 3, and each line at position 2 is illustrated with different crosshatching relative to the other lines to indicate that the line at position 2 is the specific line which is to be connected with the overlying conductive structure 12 relative to the cross-section along the row 14c. Unfortunately, other lines 10 are directly under and against the conductive structures 12 in addition to the lines 10 at positions 2. For instance, the lines 10 at positions 1 and 3 are also directly under and against portions of the conductive structures 12, and accordingly will short to the conductive structures 12 in the architecture of construction 400.

Figure 4:
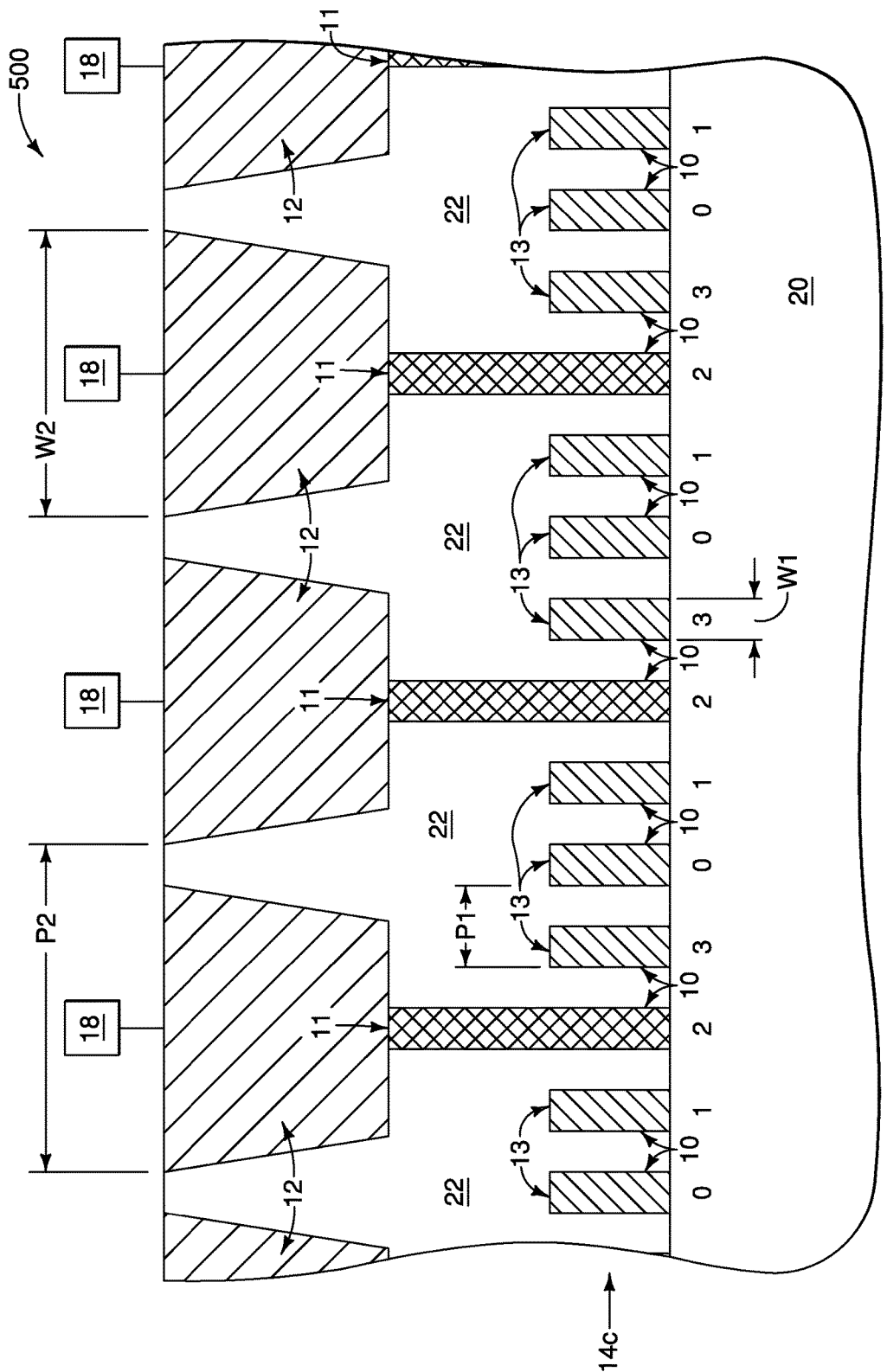
FIG. 4 is a diagrammatic cross-sectional side view of a portion of an example integrated circuit illustrating coupling between features formed along a relatively tight pitch with features formed along a relatively loose pitch, and avoiding problems described relative to the structure of FIG. 3.

FIG. 4 shows a construction 500 which alleviates the problem described above with reference to FIG. 3. Specifically, the conductive lines 10 at positions 0, 1 and 3 are recessed relative to the conductive lines 10 at positions 2, and accordingly only the conductive lines 10 at positions 2 are electrically coupled with the conductive structures 12 above them. In some embodiments, the conductive lines 10 may be referred to as first conductive structures which are spaced along the first pitch P1, and the conductive structures 12 may be referred to as second conductive structures over the first conductive structures 10 and which are spaced along the second pitch P2. The first conductive structures 10 have a first width W1 along the cross-section of FIG. 4, and the second conductive structures 12 have a second width W2 along the cross-section, with the second width being greater than the first width.

More than one of the first conductive structures 10 is directly under each of the second conductive structures 12 (for instance, the conductive structures 10 at positions 1, 2 and 3 are all directly under the conductive structures 12 above them). The conductive structures 10 at positions 2 are taller than the other conductive structures 10 along the cross-section of FIG. 4, and have uppermost surfaces 11 which extend upwardly to reach the conductive structures 12. The remaining conductive structures 10 are short along the cross-section of FIG. 4 and have uppermost surfaces 13 that are too low to reach the conductive structures 12.

In the illustrated application of FIG. 4, the second pitch P2 is about four-times greater than the first pitch P1. In other applications, the second pitch P2 may be larger than the first pitch P1 by a different amount. Generally, the problems associated with coupling loosely-pitch structures with tightly-pitch structures become increasingly significant as the disparity between the loose pitch and the tight pitch increases, and accordingly the loose pitch P2 would generally be at least about two-times the tight pitch P1 relative to the applications described herein.

The construction 500 of FIG. 4 is shown along the row 14c. The construction would have similar configurations along the other rows 14a, 14b and 14d of FIG. 2, with such other configurations connecting the first conductive structures 10 with the second conductive structures 12 at others of the positions 0, 1, 2 and 3 as appropriate relative to the configuration described with reference to FIG. 2.

FIG. 4 shows an embodiment in which insulative material 24 (FIG. 3) is a same composition as insulative material 22, and accordingly the two merge so that only insulative material 22 is shown between the first and second conductive structures 10 and 12. In other embodiments, a different insulative material may be between the conductive structures 12 than is between the conductive structures 10, analogous to the construction shown in FIG. 3.

The construction 500 of FIG. 4 may be formed with any suitable processing. Example processing is described with reference to FIGS. 5-13.

Figure 5:
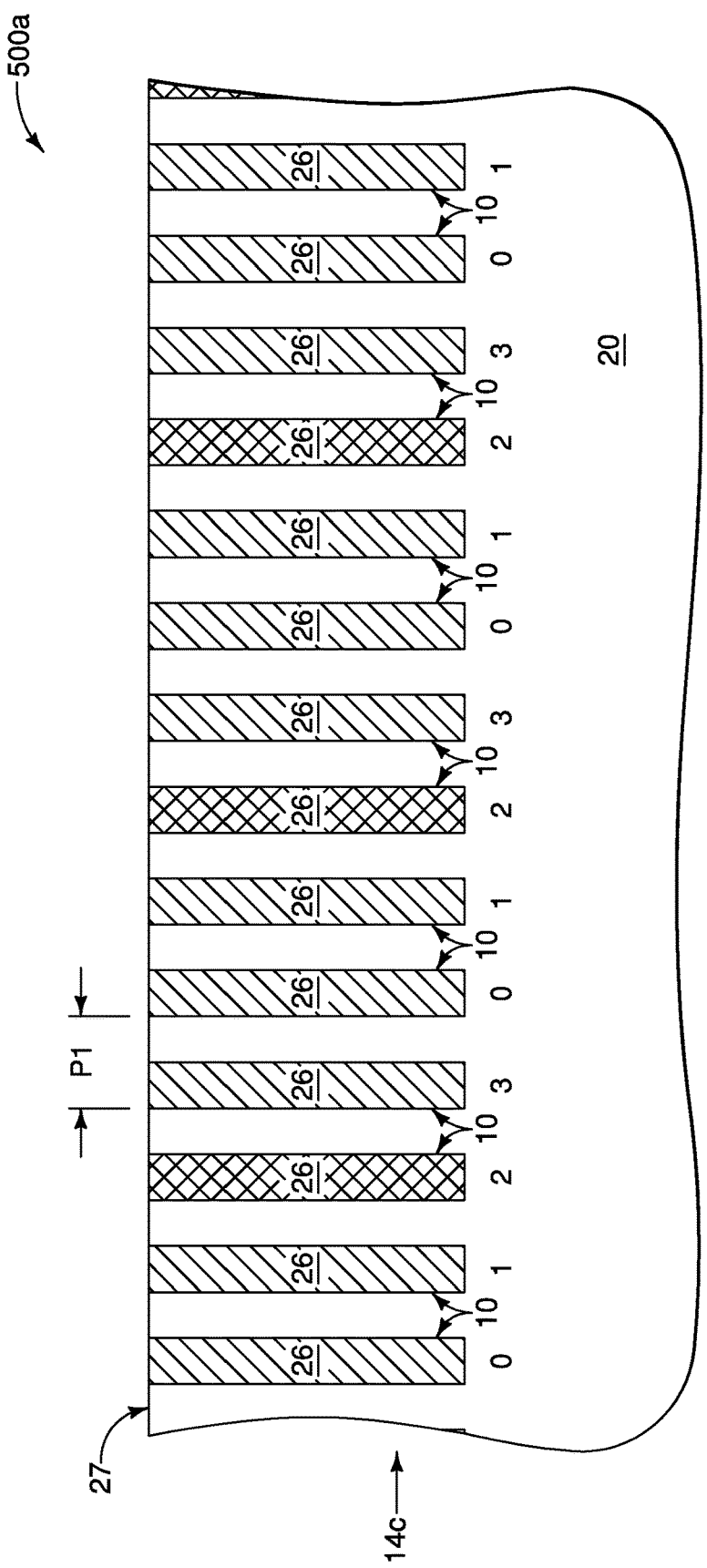
FIGS. 5-13 are diagrammatic cross-sectional side views of a portion of an example construction at example processing stages of an example method for coupling features along a relatively tight pitch with features along a relatively loose pitch.

Referring to FIG. 5, a construction 500a is shown at a processing stage after the first conductive structures 10 are formed within an insulative support material 20; with the first conductive structures 10 being spaced along the first pitch P1. The pitch P1 may be any suitable pitch, and in some embodiments may be within a range of from about 25 nanometers (nm) to about 250 nm. In the embodiment of FIG. 5, the same insulative material is under the structures 10 as is between the structures 10. In other embodiments, a different insulative material may be between the structures 10 than is under the structures 10, analogous to the construction shown in FIG. 3.

The insulative support material 20 may comprise any suitable composition or combination of compositions; and in some embodiments may comprise, consist essentially of, or consist of silicon dioxide. The insulative support material 20 may be provided over an underlying base (not shown) corresponding to a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The first conductive structures 10 comprise conductive material 26. The conductive material 26 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). Each conductive structure 10 at position 2 is illustrated with different crosshatching relative to the other conductive structures 10 to indicate that the conductive structures at position 2 are the specific conductive structures which are to be connected with the overlying conductive structure 12 (shown in FIG. 4) relative to the illustrated cross-section along the row 14c.

The construction 500a is shown to have a planarized upper surface 27 extending across the insulative support material and the conductive structures 10. Such planarized surface 27 may result from chemical-mechanical polishing (CMP) or any other suitable polishing process.

The conductive structures 10 may be conductive lines 10 which extend in and out of the page relative to the cross-section of FIG. 5.

Figure 5A:
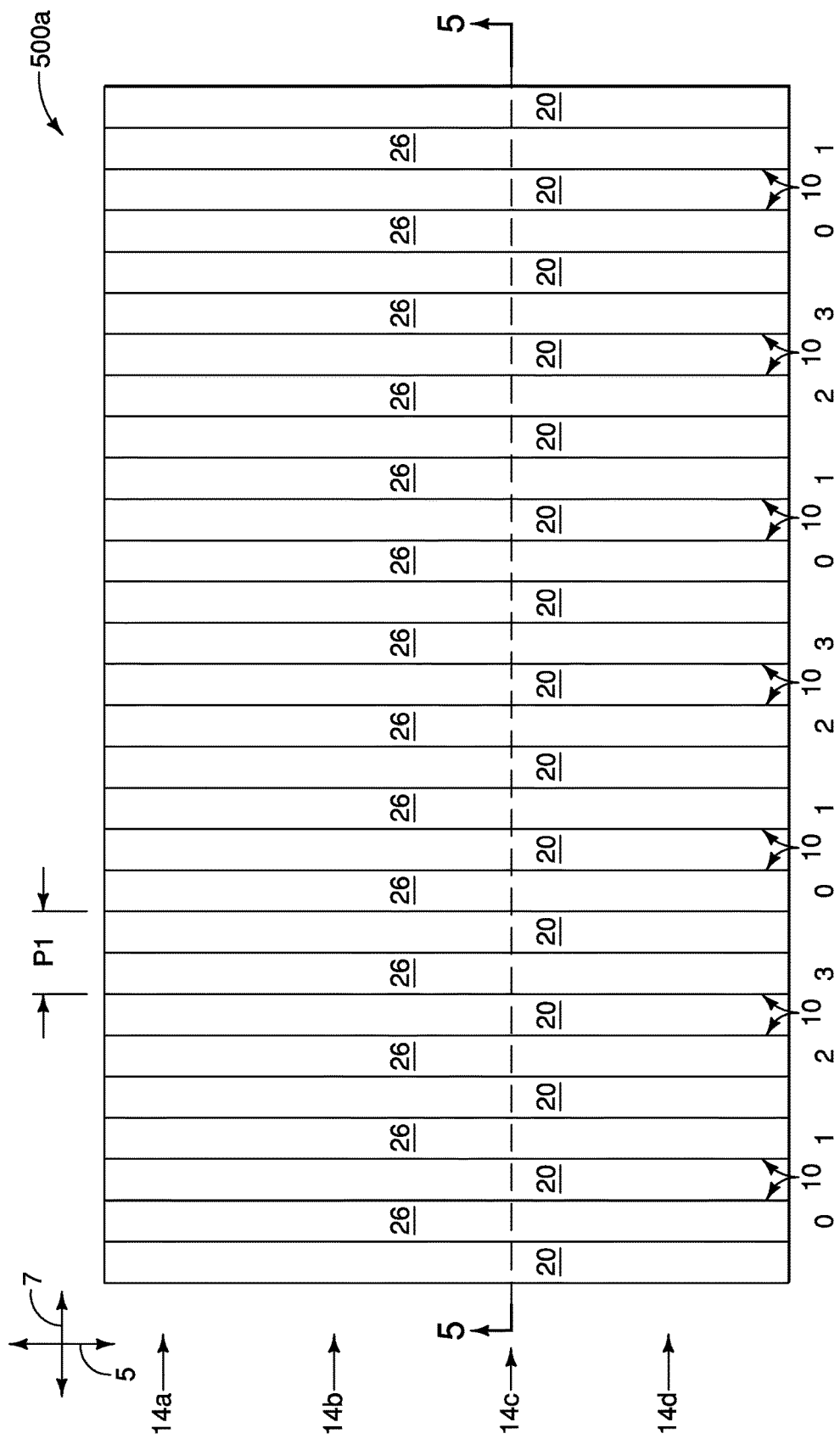
FIGS. 5A, 6A, 7A, 8A, 10A and 12A are diagrammatic top views of regions of the constructions of FIGS. 5, 6, 7, 8, 10 and 12, respectively; with FIG. 5 being along the line 5-5 of FIG. 5A, FIG. 6 being along the line 6-6 of FIG. 6A, FIG. 7 being along the line 7-7 of FIG. 7A, FIG. 8 being along the line 8-8 of FIG. 8A, FIG. 10 being along the line 10-10 of FIG. 10 and FIG. 12 being along the line 12-12 of FIG. 12A.

FIG. 5A shows a top view of a portion of the construction 500a at the processing stage of FIG. 5, and shows that the conductive structures 10 are lines extending along a first direction corresponding to the axis 5, and are spaced from one another along the pitch P1; with the pitch P1 extending along the second direction corresponding to the axis 7.

Figure 6:
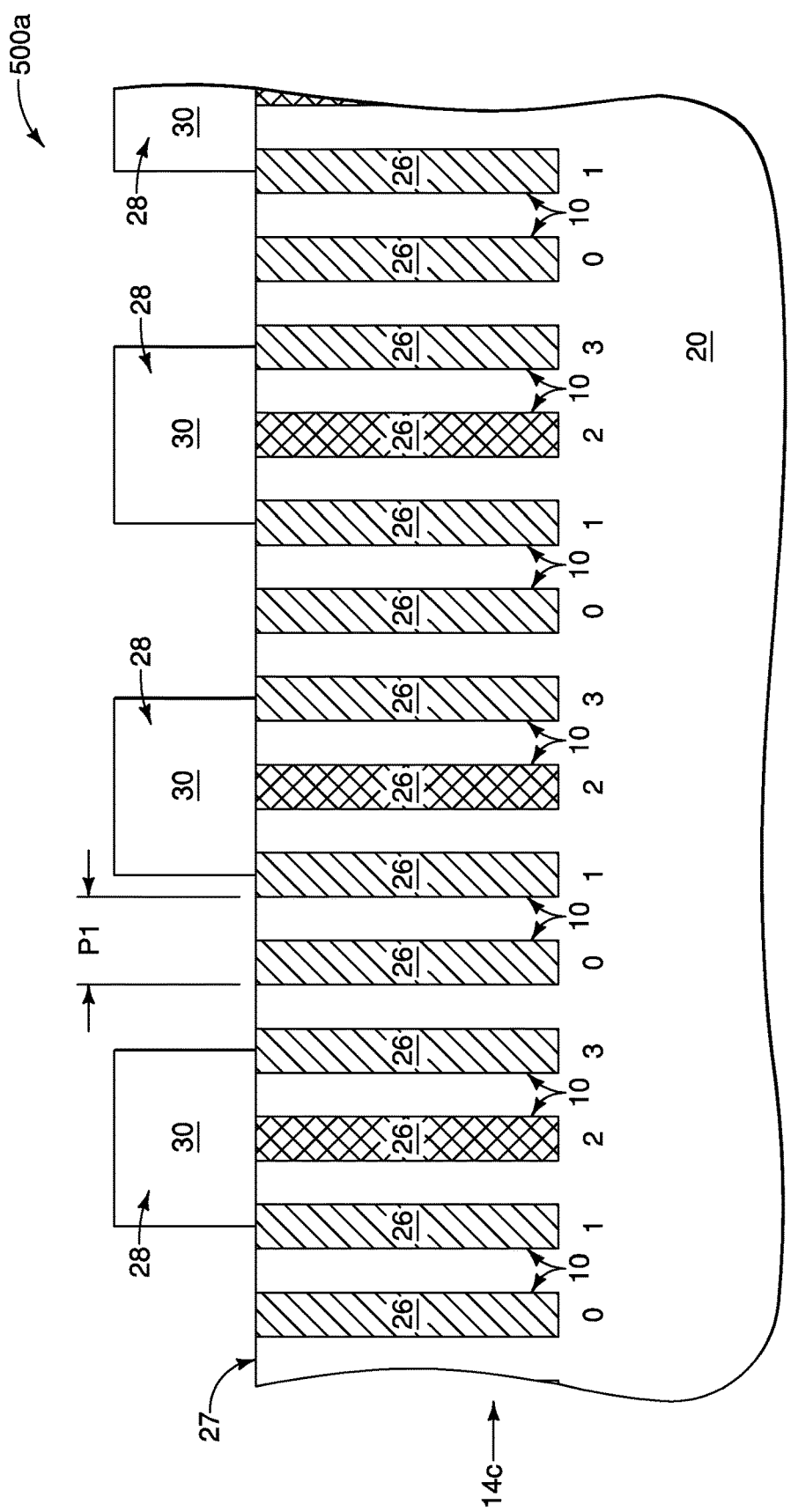

Referring to FIG. 6, patterned structures 28 are formed over the conductive structures 10. Such patterned structures comprise a material 30. The material 30 may comprise any suitable composition or combination of compositions; and in some embodiments may comprise photolithographically-patterned photoresist over amorphous carbon.

Figure 6A:
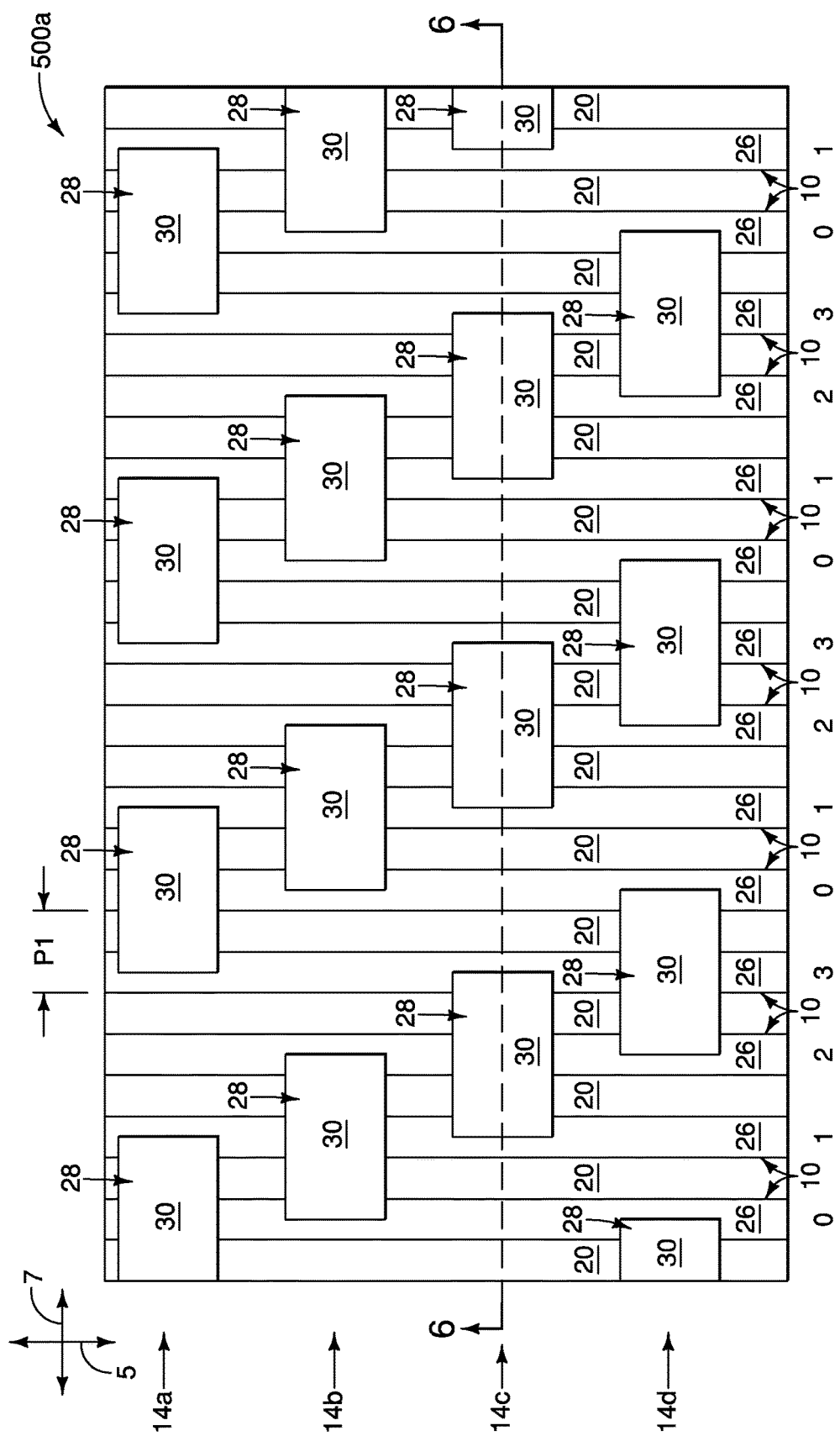

The cross-section of FIG. 6 shows the patterned structures 28 formed over some of the conductive structures 10, while leaving others of the conductive structures uncovered. In applications in which the conductive structures 10 are lines extending in and out of the page relative to the cross-section of FIG. 6, the patterned structures 28 may protect some regions of such lines while leaving other regions unprotected. FIG. 6A shows a top view of the construction 500a at the processing stage of FIG. 6 in an application in which the conductive structures 10 are lines, and shows the patterned structures 28 arranged along the rows 14a-14d. Each of the patterned structures 28 extends across two or more of the conductive lines 10.

Figure 7:
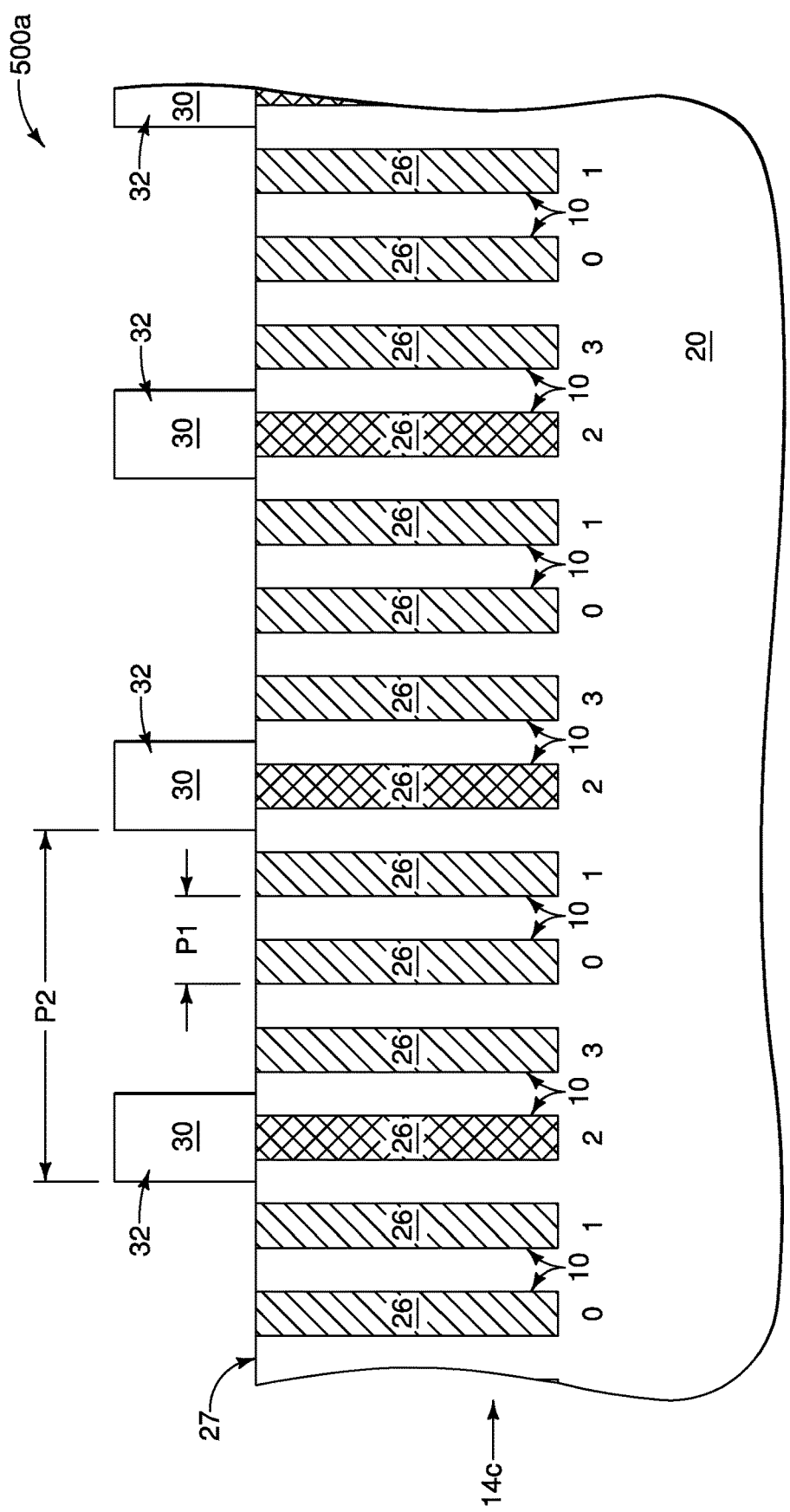
Figure 7A:
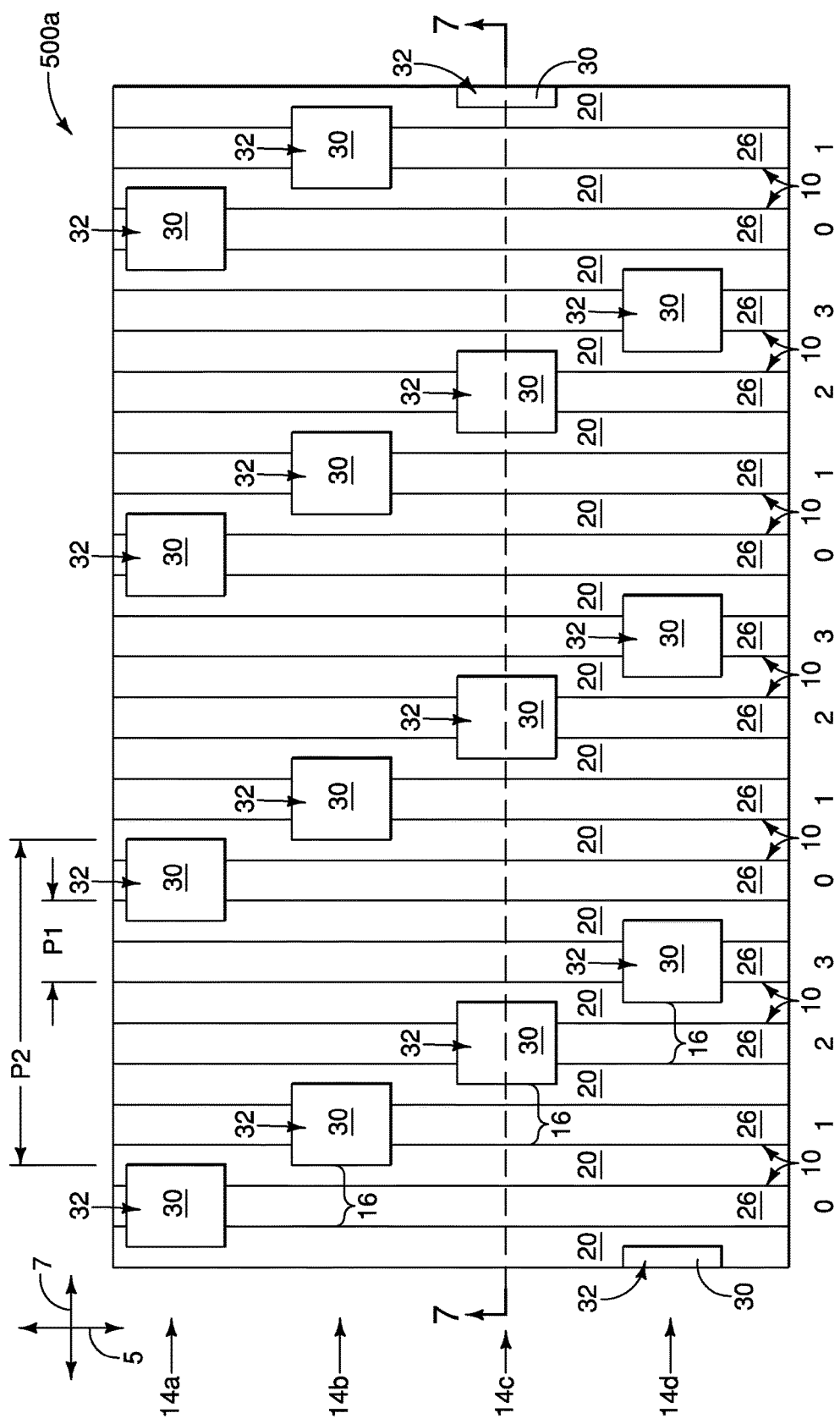

Referring to FIGS. 7 and 7A, the patterned structures 28 (FIG. 6) are trimmed into protective material knobs 32 that each cover only a single conductive line 10. Such trimming may utilize any suitable processing. In some embodiments, the structures 28 may be initially formed to only overlap single conductive structures 10, and accordingly the trimming of FIGS. 7 and 7A may be omitted; and instead the structures 28 formed at a processing stage analogous to that of FIGS. 6 and 6A may correspond to the protective material knobs 32.

The protective material knobs 32 within each of the rows 14a-14d are spaced along the second pitch P2. Also, the protective material knobs within adjacent rows 14a-14d are offset relative to one another along the second direction of axis 7 by the increment 16 corresponding to the first pitch P1.

The protective material knobs 32 protect regions of the conductive lines 10, while leaving other regions of the conductive lines unprotected.

Figure 8:
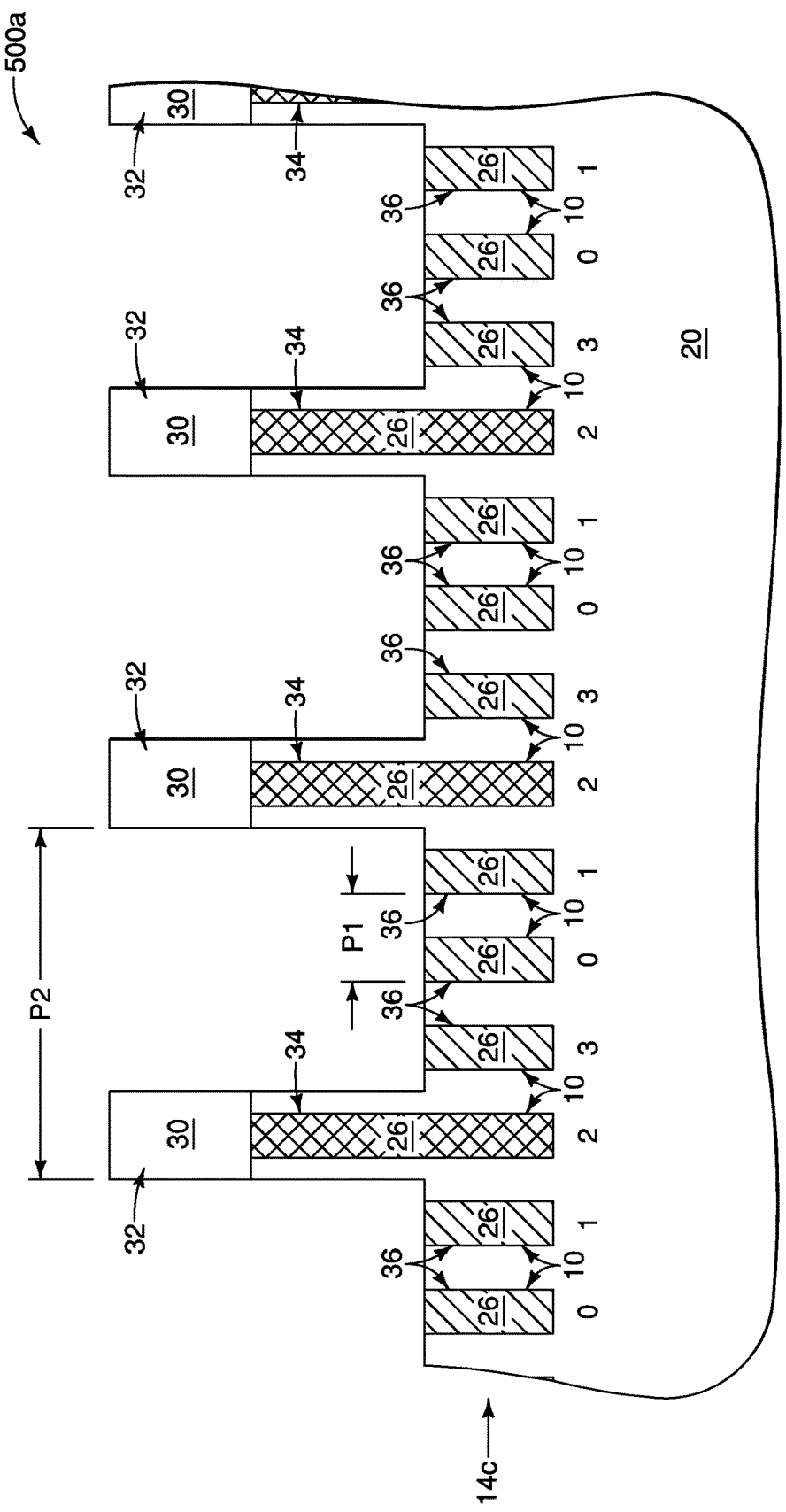
Figure 8A:
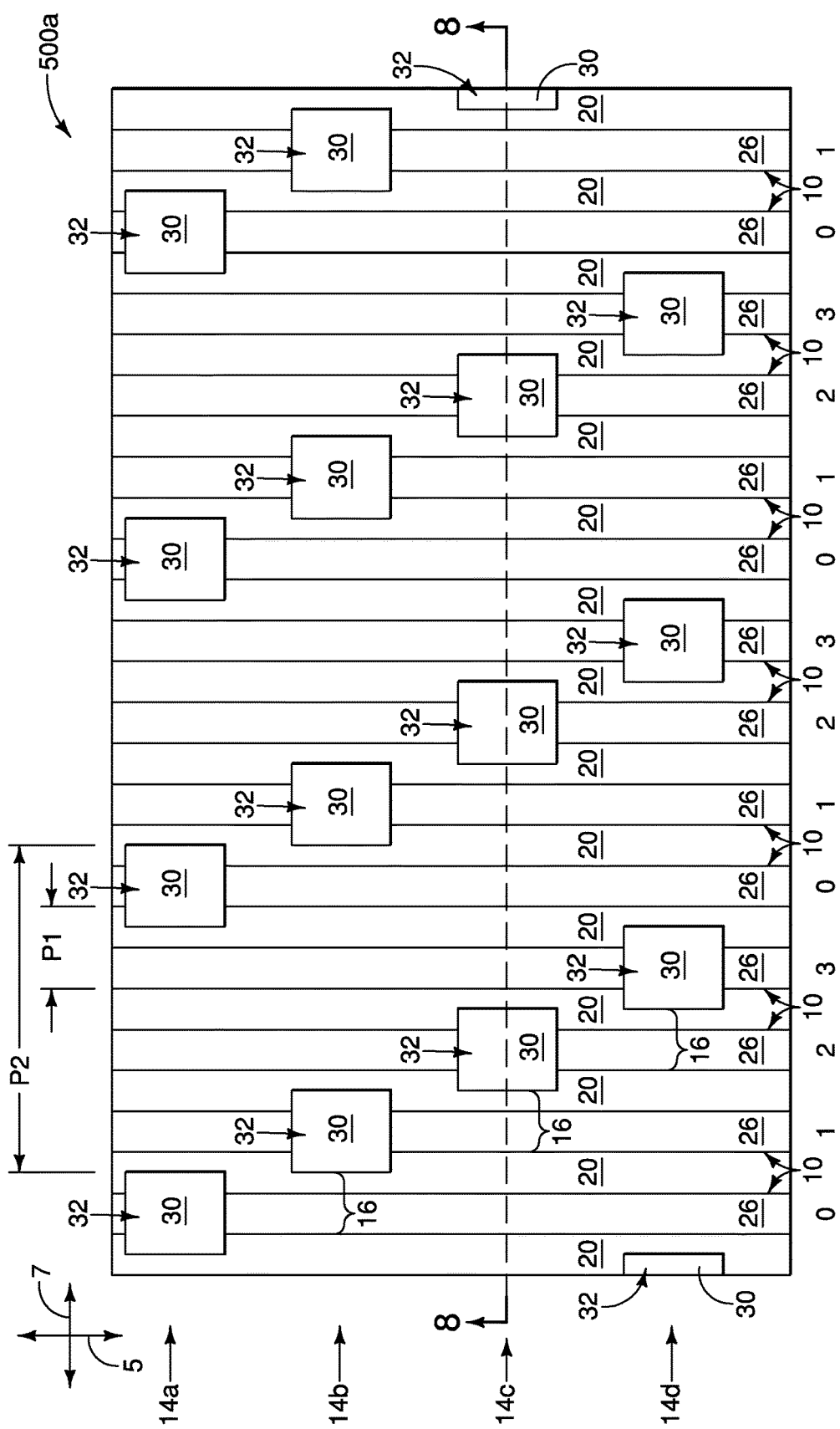

Referring to FIGS. 8 and 8A, regions of conductive lines 10 and insulative support material 20 which are not covered by the protective material knobs 32 are recessed relative to regions protected by the protective material knobs 32. The protected regions of the conductive lines 10 become tall regions 34, and the unprotected regions of the conductive lines become short regions 36. In the illustrated embodiment, some of the insulative support material 20 which is laterally adjacent the protected regions of the conductive lines 10 is also protected by the knobs 32, and is not recessed. In other embodiments, the knobs 32 may be precisely aligned with the underlying conductive lines 10 so that the knobs do not project laterally beyond the conductive lines 10.

Figure 9:
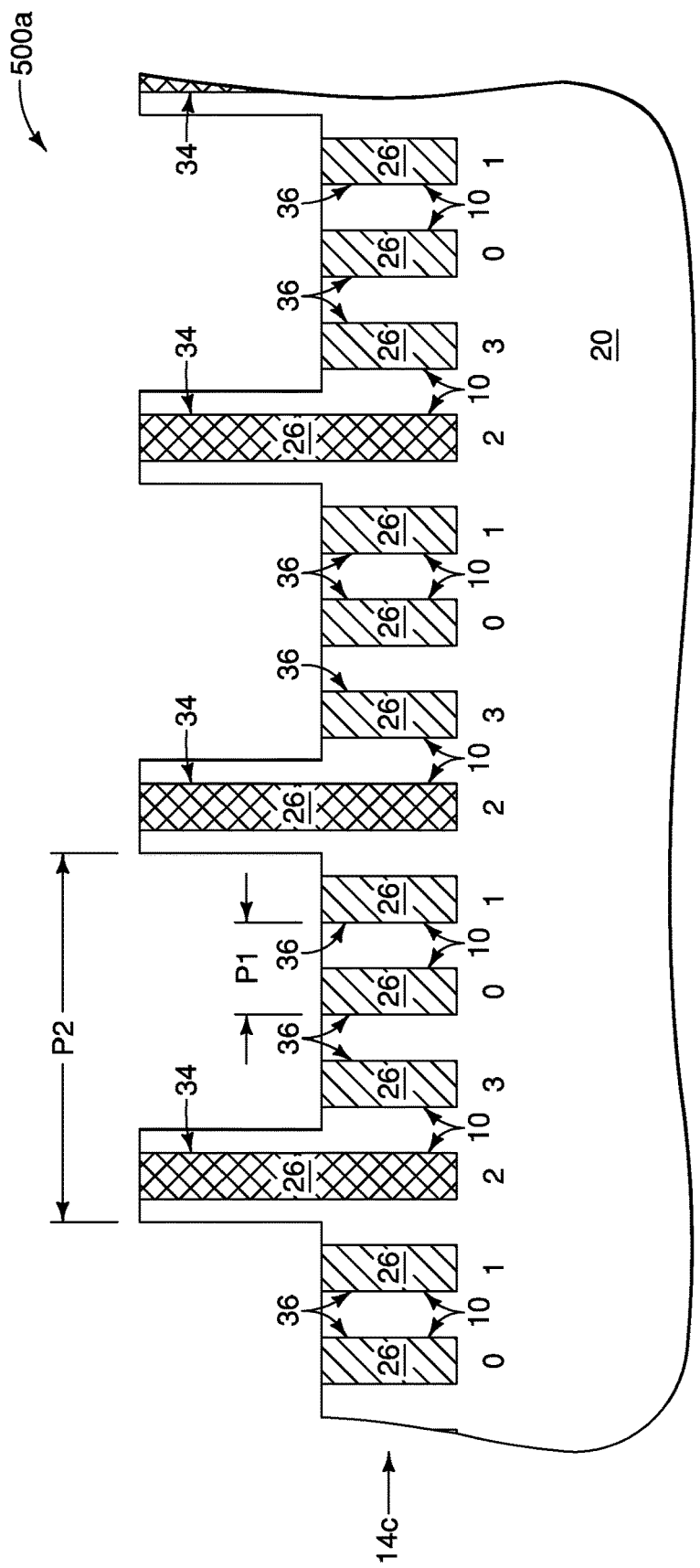

Referring to FIG. 9, the protective knobs 32 (FIGS. 8 and 8A) are removed.

Figure 10:
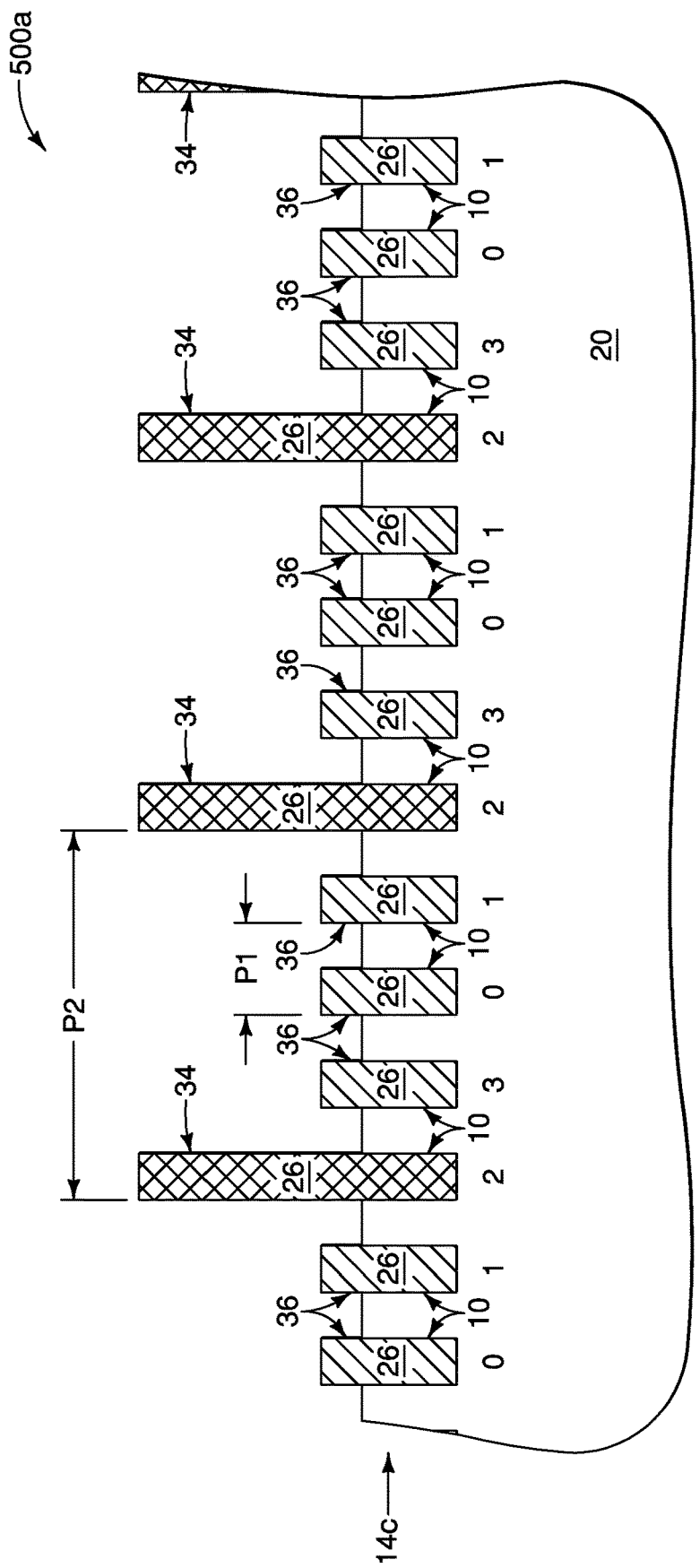
Figure 10A:
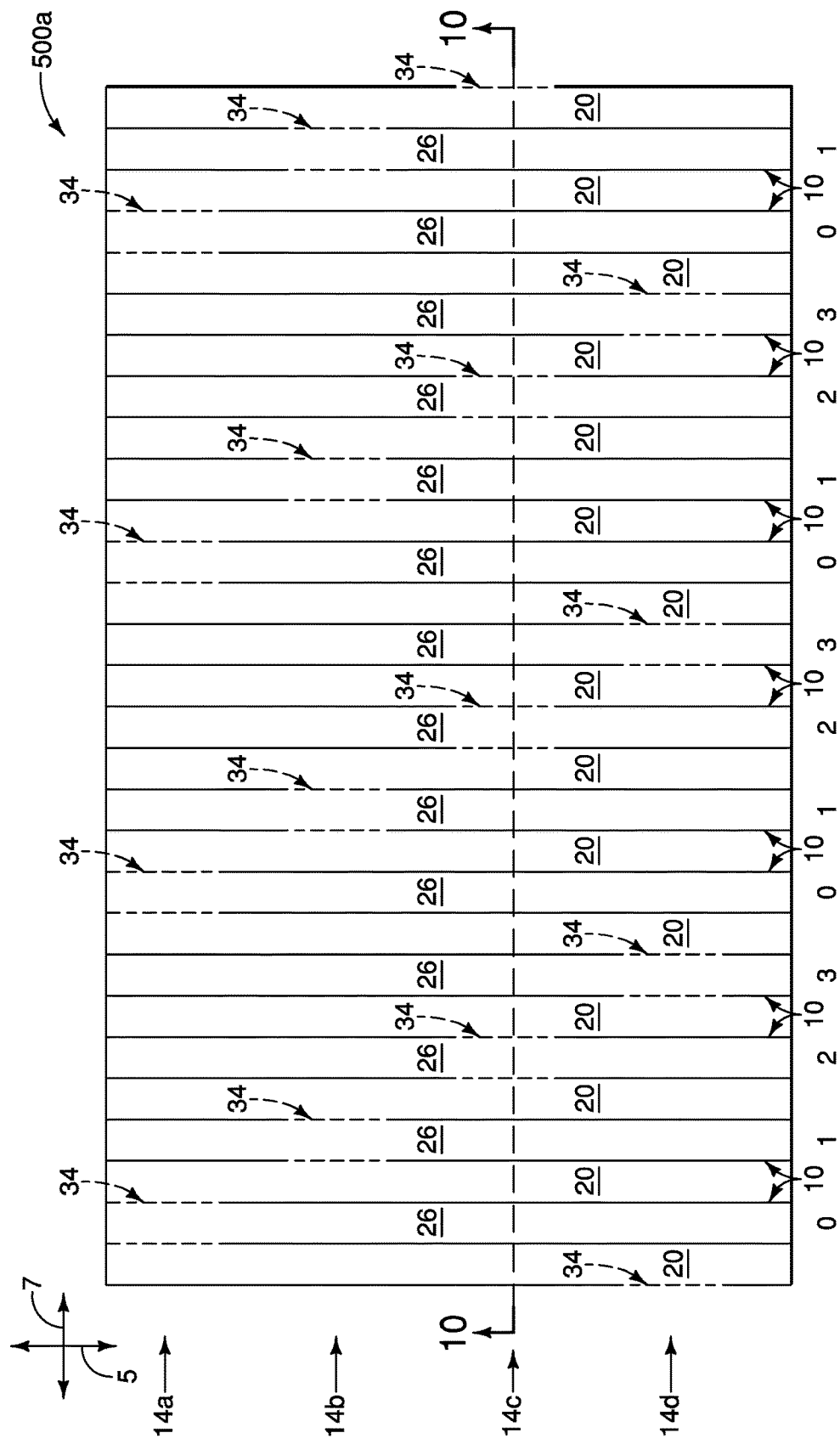

Referring to FIGS. 10 and 10A, the insulative support material 20 is recessed relative to the conductive lines 10. In the shown embodiment, the insulative material 20 is recessed to a level beneath the upper surfaces of the short regions 36 of conductive lines 10.

The top view of FIG. 10A shows the tall regions 34 of the conductive lines 10 arranged along the rows 14a-14d.

Figure 11:
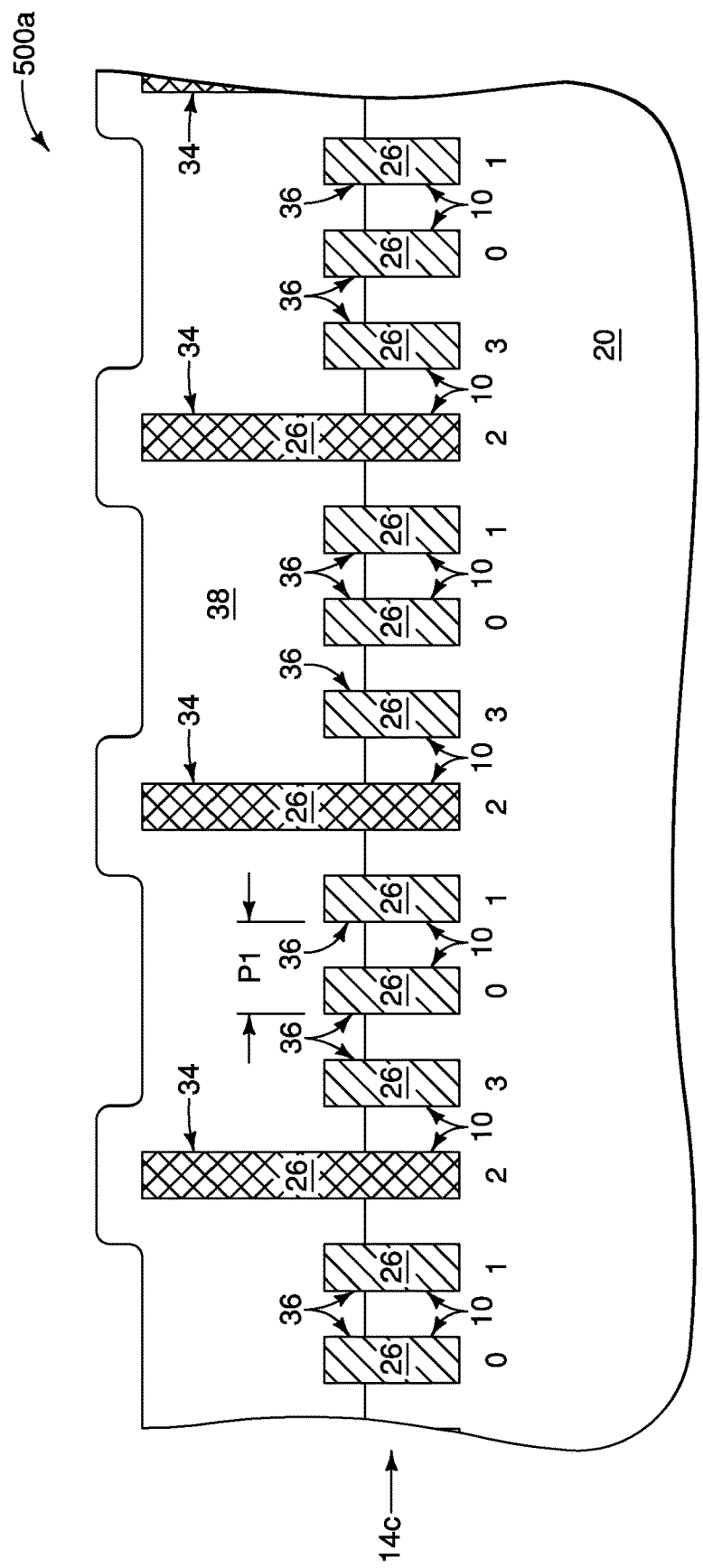

Referring to FIG. 11, an insulative material 38 is formed over the insulative support material 20, over the short regions 36 of the conductive lines 10, and over the tall regions 34 of the conductive lines. In some embodiments, the insulative support material 20 may be referred to as a first insulative material, and the insulative material 38 may be referred to as a second insulative material. The second insulative material 38 may comprise any suitable composition or combination of compositions; and in some embodiments may comprise a different composition relative to the first insulative material 20. For instance, in some embodiments the second insulative material 38 may comprise, consist essentially of, or consist of silicon nitride; and the first insulative material 20 may comprise, consist essentially of, or consist of silicon dioxide. In other embodiments, the insulative materials 20 and 38 may be a same composition as one another.

Figure 12:
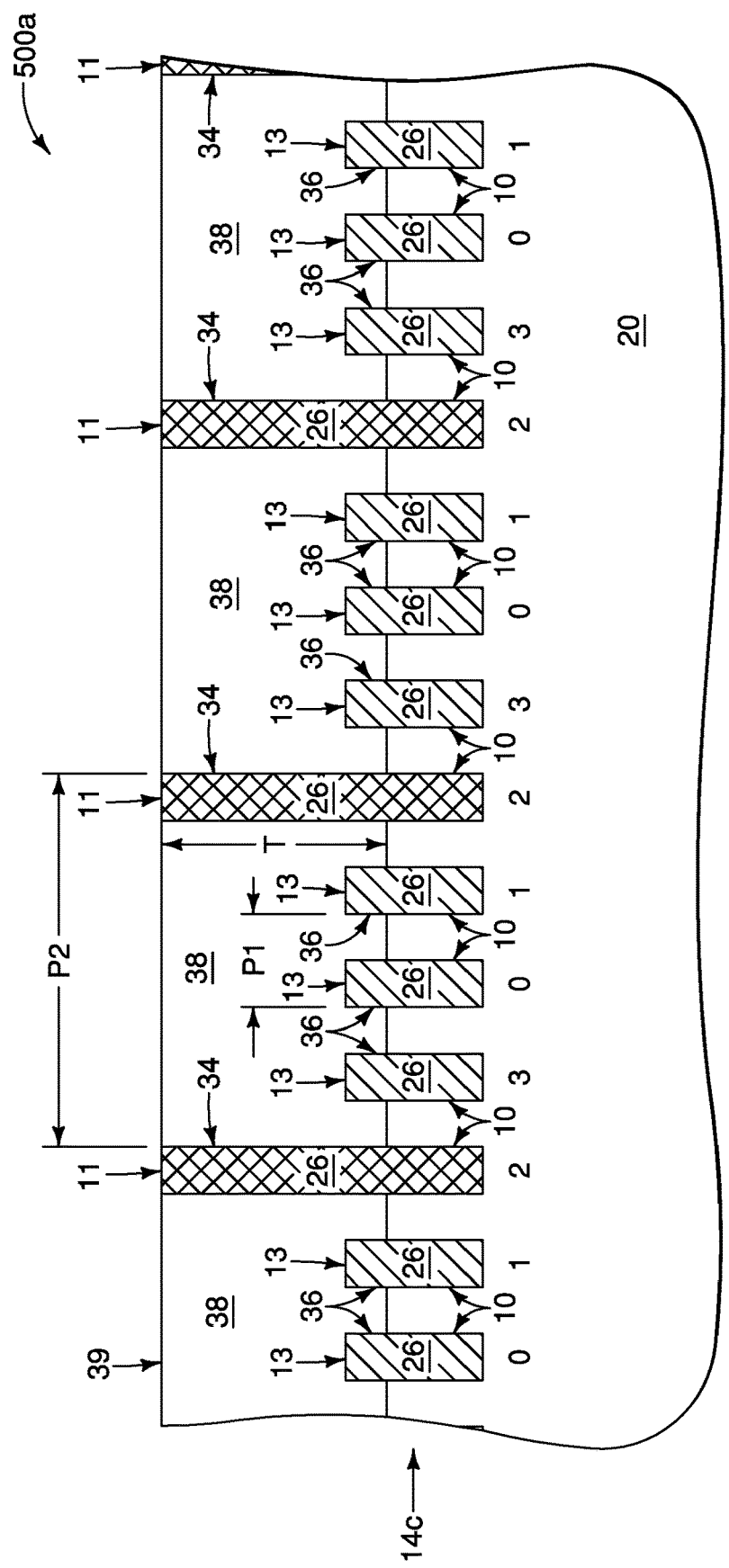
Figure 12A:
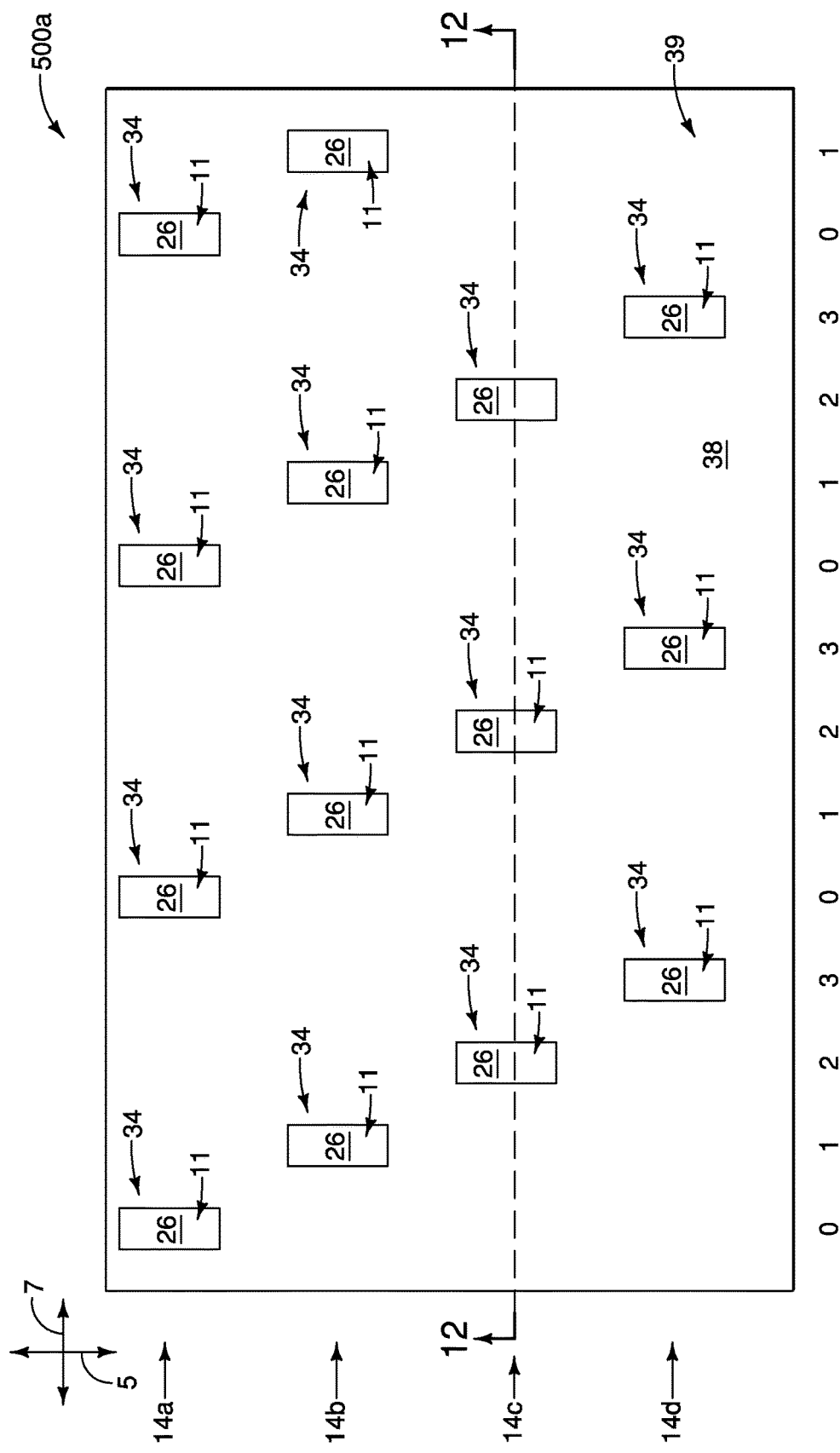

Referring to FIGS. 12 and 12A, a planarizing process (e.g., chemical-mechanical polishing) is utilized to remove some of the insulative material 38 and form a planar surface 39 extending along the insulative material 38 and along the tall regions 34 of the conductive lines 10. After the planarizing process, the tall regions 34 of the conductive lines 10 have the first uppermost surfaces 11, and the short regions 36 of the conductive lines 10 have the second uppermost surfaces 13 which are beneath the first uppermost surfaces 11. In some embodiments, the second uppermost surfaces 13 may be at least about 100 Å below the first uppermost surfaces 11. FIGS. 12 and 12A show that the first uppermost surfaces 11 of tall regions 34 are exposed along the planarized surface 39, while the second uppermost surfaces 13 are not exposed. The material 38 may have a thickness T within a range of from about 100 Å to about 300 Å at the processing stage of FIG. 12.

Figure 13:
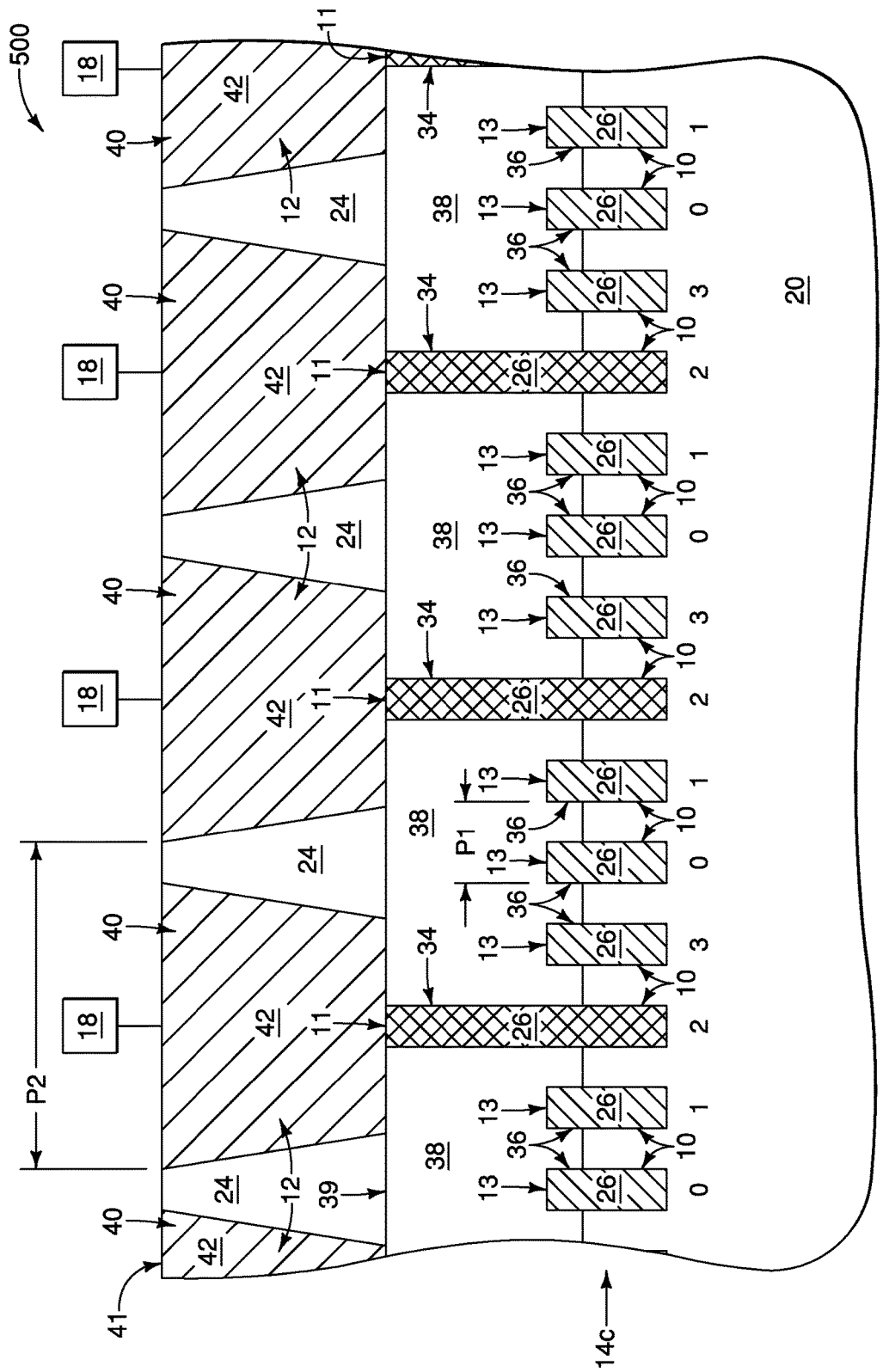

Referring to FIG. 13, insulative material 24 is formed over the planarized surface 39 and patterned to have openings 40 extending therethrough. Subsequently, conductive material 42 is formed within the openings 40. The conductive material 42 may be initially provided within the openings 40 and over an upper surface of the insulative material 24, and may then be removed with a planarizing process (e.g., CMP) to form the illustrated planarized upper surface 41 and to pattern the material 42 into the conductive structures 12.

Conductive material 42 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 42 of components 12 may comprise a same composition as the conductive material 26 of the conductive lines 10; and in other embodiments the conductive material 12 may comprise a different composition relative to the conductive material 26.

The conductive structures 12 may be electrically coupled with the circuitry 18 described above. The conductive structures may be arranged in the rows 14a-14d described above with reference to FIG. 2, and the conductive structures 12 along the row 14c are specifically illustrated relative to the cross-section of FIG. 13.

In some embodiments, the second conductive structures 12 may be considered to be in a row 14c extending in a first direction along the plane of the cross-section of FIG. 13, and the lines corresponding to the first conductive structures 10 may be considered to extend in a second direction which is orthogonal to the first direction. The conductive lines corresponding to conductive structures 10 may be wordlines or digit lines extending to a memory array. If the conductive lines are wordlines, then the components 18 coupled with the conductive structures 12 may be wordline drivers. If the conductive lines are digit lines, then the components 18 coupled with the conductive structures 12 may be sense amplifiers.

FIG. 2 shows a configuration in which the conductive structures 10 are conductive lines 10. The configuration of FIG. 13 enables each of the conductive lines 10 at position 2 of row 14c of FIG. 2 to be uniquely coupled to a conductive structure 12. Similar configurations along the rows 14a, 14b and 14d of FIG. 2 enable each of the conductive lines 10 within the configuration of FIG. 2 to be uniquely coupled to only one of the conductive structures 12 relative to all others of the conductive lines 10.

The constructions discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having first conductive structures spaced along a first pitch along a cross-section, with the first conductive structures having a first width along the cross-section; and having second conductive structures over the first conductive structures and spaced along a second pitch along the cross-section, with the second pitch being at least about two-times greater than the first pitch. The second conductive structures have a second width along the cross-section which is greater than the first width. Each of the second conductive structures is directly over more than one of the first conductive structures along the cross-section. Each of the second conductive structures is coupled with only one of the first conductive structures directly under the second conductive structures along the cross-section. The first conductive structures which are coupled with the second conductive structures along the cross-section have first uppermost surfaces. some of the first conductive structures being directly under the second conductive structures and not being coupled to the second conductive structures. Said some of the first conductive structures having second uppermost surfaces which are below the first uppermost surfaces.

Some embodiments include a method of forming an integrated assembly. First conductive structures are formed within an insulative support material. The first conductive structures are a row of regularly spaced features along a cross-section, with the regularly spaced features being spaced along a first pitch along the cross-section. Protective material is formed over some of the first conductive structures while leaving others of the first conductive structures uncovered by the protective material. The first conductive structures which have the protective material formed thereover are protected first conductive structures and the remaining first conductive structures are unprotected first conductive structures. The protected first conductive structures are provided at regular intervals and are along a second pitch along the cross-section, with the second pitch being at least about two-times greater than the first pitch. The unprotected first conductive structures are recessed relative to the protected first conductive structures. After the recessing, the protected first conductive structures are tall first conductive structures having first upper surfaces, and the unprotected first conductive structures are short first conductive structures having second upper surfaces. The first upper surfaces are at least about 100 Å above the second upper surfaces. The protective material is removed. second conductive structures are formed over the first conductive structures. The second conductive structures are spaced along the second pitch along the cross-section. The second conductive structures are electrically coupled to the tall first conductive structures and are not being electrically coupled to the short first conductive structures. At least some of the short first conductive structures are directly under the second conductive structures along the cross-section and are spaced from the second conductive structures by one or more intervening insulative materials.

Some embodiments include a method of forming an integrated assembly. Conductive lines are formed within an insulative support material. The conductive lines extend along a first direction, and are spaced from one another by a first pitch along a second direction. The second direction is substantially orthogonal to the first direction. Protective material knobs are formed over the conductive lines, and are arranged in rows. The rows extend along the second direction. The protective material knobs within each row are spaced along a second pitch along the second direction. The second pitch is at least about two-times greater than the first pitch. Adjacent rows are offset relative to one another along the second direction by an increment corresponding to the first pitch. The protective material knobs protect regions of the conductive lines while leaving other regions of the conductive lines unprotected. The unprotected regions of the conductive lines are recessed relative to the protected regions of the conductive lines. After the recessing, the protected regions of the conductive lines are tall regions having first upper surfaces and the unprotected regions of the conductive lines are short regions having second upper surfaces below the first upper surfaces. The protective material knobs are removed. Conductive structures are formed over the conductive lines. The conductive structures are spaced along the second pitch along the second direction. The conductive structures are electrically coupled to the tall regions of the conductive lines. Each of the conductive lines is uniquely coupled to only one of the conductive structures relative to all others of the conductive lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   first conductive structures spaced along a first pitch along a cross-section; the first conductive structures having a first width along the cross-section;
   second conductive structures over the first conductive structures and spaced along a second pitch along the cross-section, the second pitch being at least about two-times greater than the first pitch; the second conductive structures having a second width along the cross-section which is greater than the first width; each of the second conductive structures being directly over more than one of the first conductive structures along the cross-section; and
   each of the second conductive structures being coupled with only one of the first conductive structures directly under the second conductive structures along the cross-section; the first conductive structures which are coupled with the second conductive structures along the cross-section having first uppermost surfaces; some of the first conductive structures being directly under the second conductive structures and not being coupled to the second conductive structures; said some of the first conductive structures having second uppermost surfaces below the first uppermost surfaces.

2. The integrated assembly of claim 1 wherein the first conductive structures are wordlines extending to a memory array.

3. The integrated assembly of claim 1 wherein the first conductive structures are digit lines extending to a memory array.

4. An integrated assembly, comprising:
first conductive structures spaced along a first pitch along a cross-section; the first conductive structures having a first width along the cross-section;
second conductive structures over the first conductive structures and spaced along a second pitch along the cross-section, the second pitch being at least about three-times greater than the first pitch; the second conductive structures having a second width along the cross-section which is greater than the first width; each of the second conductive structures being directly over more than one of the first conductive structures along the cross-section; each of the second conductive structures being an isosceles trapezoid along the cross-section; each of the isosceles trapezoids having sidewall edges extending downwardly from a top edge to a bottom edge, with the top edges being wider than the bottom edges; the sidewall edges joining to the top edges at first angles and joining to the bottom edges at second angles, with the second angles being different than the first angels; and
each of the second conductive structures being directly against only one of the first conductive structures directly under the second conductive structures along the cross-section; the first conductive structures which are directly against the second conductive structures along the cross-section having first uppermost surfaces directly against the second conductive structures; some of the first conductive structures being directly under the second conductive structures and not being directly against the second conductive structures; said some of the first conductive structures having second uppermost surfaces below the first uppermost surfaces.

5. The integrated assembly of claim 4 wherein the first conductive structures extend through an insulative support material; and wherein a second insulative material is over the insulative support material and over the second uppermost surfaces.

6. The integrated assembly of claim 4 wherein the insulative support material comprises silicon dioxide and the second insulative material comprises silicon nitride.

7. The integrated assembly of claim 4 wherein the second insulative material has a thickness within a range of from about 100 Å to about 300 Å.

8. A method of forming an integrated assembly, comprising:
forming first conductive structures within an insulative support material, the first conductive structures being a row of regularly spaced features along a cross-section, with the regularly spaced features being spaced along a first pitch along the cross-section;
forming protective material over some of the first conductive structures while leaving others of the first conductive structures uncovered by the protective material; the first conductive structures having the protective material formed thereover being protected first conductive structures and the remaining first conductive structures being unprotected first conductive structures; the protected first conductive structures being provided at regular intervals and being along a second pitch along the cross-section, with the second pitch being at least about two-times greater than the first pitch;
recessing the unprotected first conductive structures relative to the protected first conductive structures; after the recessing, the protected first conductive structures being tall first conductive structures having first upper surfaces and the unprotected first conductive structures being short first conductive structures having second upper surfaces;
removing the protective material; and
forming second conductive structures over the first conductive structures; the second conductive structures being spaced along the second pitch along the cross-section; the second conductive structures being electrically coupled to the tall first conductive structures and not being electrically coupled to the short first conductive structures; at least some of the short first conductive structures being directly under the second conductive structures along the cross-section.

9. The method of claim 8 wherein the second pitch is about three-times greater than the first pitch.

10. The method of claim 8 wherein the second pitch is about four-times greater than the first pitch.

11. The method of claim 8 wherein the insulative support material comprises a first composition; wherein the protective material extends over regions of the insulative support material laterally adjacent the protected first conductive structures; and wherein the method further comprises:
after removing the protective material, recessing the regions of the insulative support material to a level at or below the second upper surfaces of the short first conductive structures;
after recessing the regions of the insulative support material, forming a layer of second insulative material over the insulative support material, over the short first conductive structures and over the tall first conductive structures;
removing some of the second insulative material with a planarizing process which forms a planar surface extending along the second insulative material and along the tall first conductive structures; and
forming the second conductive structures on the planarized surface.

12. The method of claim 11 wherein the insulative support material comprises silicon dioxide and the second insulative material comprises silicon nitride.

13. The method of claim 12 wherein the second insulative material has a thickness within a range of from about 100 Å to about 300 Å after the planarizing process.

* * * * *

UNITED STATES PATENT AND TRADEMARK OFFICE
CERTIFICATE OF CORRECTION

PATENT NO. : 10,388,606 B2
APPLICATION NO. : 16/010734
DATED : August 20, 2019
INVENTOR(S) : Werner Juengling It is certified that error appears in the above-identified patent and that said Letters Patent is hereby corrected as shown below:

In the Claims

Column 11, Line 21 – Replace "first angels" with --first angles--

Signed and Sealed this
Twenty-sixth Day of November, 2019

Andrei Iancu
*Director of the United States Patent and Trademark Office*